(12) United States Patent
Kunie

(10) Patent No.: US 10,008,285 B2
(45) Date of Patent: Jun. 26, 2018

(54) SEMICONDUCTOR DEVICE

(71) Applicant: KABUSHIKI KAISHA TOSHIBA, Tokyo (JP)

(72) Inventor: Shuichi Kunie, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/445,772

(22) Filed: Feb. 28, 2017

(65) Prior Publication Data

US 2018/0082755 A1    Mar. 22, 2018

(30) Foreign Application Priority Data

Sep. 16, 2016 (JP) .................................. 2016-181290

(51) Int. Cl.
 G11C 11/00    (2006.01)
 G11C 29/12    (2006.01)
 G11C 11/417   (2006.01)

(52) U.S. Cl.
 CPC ........ G11C 29/1201 (2013.01); G11C 11/417 (2013.01)

(58) Field of Classification Search
 CPC ......... G11C 14/00; G11C 7/22; G11C 7/1072; G11C 11/4076; G11C 11/408; G11C 11/4082; G11C 11/4087; G11C 2207/2281; G11C 7/1018; G11C 7/222; G11C 7/225; G11C 11/406; G11C 11/40618; G11C 7/1045

USPC ......... 365/145, 230.03, 189.05, 201, 189.08, 365/189.15, 189.16, 196, 203, 207, 365/233.11, 149, 154, 194
See application file for complete search history.

(56) References Cited

U.S. PATENT DOCUMENTS 7,221,205 B2    5/2007  Kinkade et al.
2009/0024861 A1*  1/2009  Shimazaki ..... G01R 31/318575
                                                      713/324

FOREIGN PATENT DOCUMENTS

JP    2006025400 A    1/2006
JP    2008078754 A    4/2008
JP    2014027465 A    2/2014

* cited by examiner

*Primary Examiner* — Thong Q Le
(74) *Attorney, Agent, or Firm* — Patterson & Sheridan, LLP

(57) ABSTRACT

A semiconductor device includes a flip-flop circuit that includes a first and a second latch coupled to the first latch. The first latch stores data in a first operating mode in which power is supplied to the first latch and is shut off in a second operating mode in which power is not supplied to the first latch. The second latch can store the data from the first latch during a transition from the first operating mode to the second operating mode. The first latch can be tested during a first period in the first operating mode. The second latch retains the data from the first latch during the first period and can be tested during a second period beginning in the first operating mode.

19 Claims, 6 Drawing Sheets

US 10,008,285 B2

SEMICONDUCTOR DEVICE

CROSS-REFERENCE TO RELATED APPLICATION

This application is based upon and claims the benefit of priority from Japanese Patent Application No. 2016-181290, filed Sep. 16, 2016, the entire contents of which are incorporated herein by reference.

FIELD

Embodiments relate to a semiconductor device.

BACKGROUND

In the field of automobiles, industrial machines and the like, highly reliable semiconductor devices are often required. In this context, the ISO 26262 Automotive Safety Integrity Level (ASIL) is known as an international standard of functional safety of automobile components. Some systems that are in compliance with ASIL have a function of executing a built in self test (BIST) even when the systems are otherwise operating normally.

DETAILED DESCRIPTION

Figure 1:
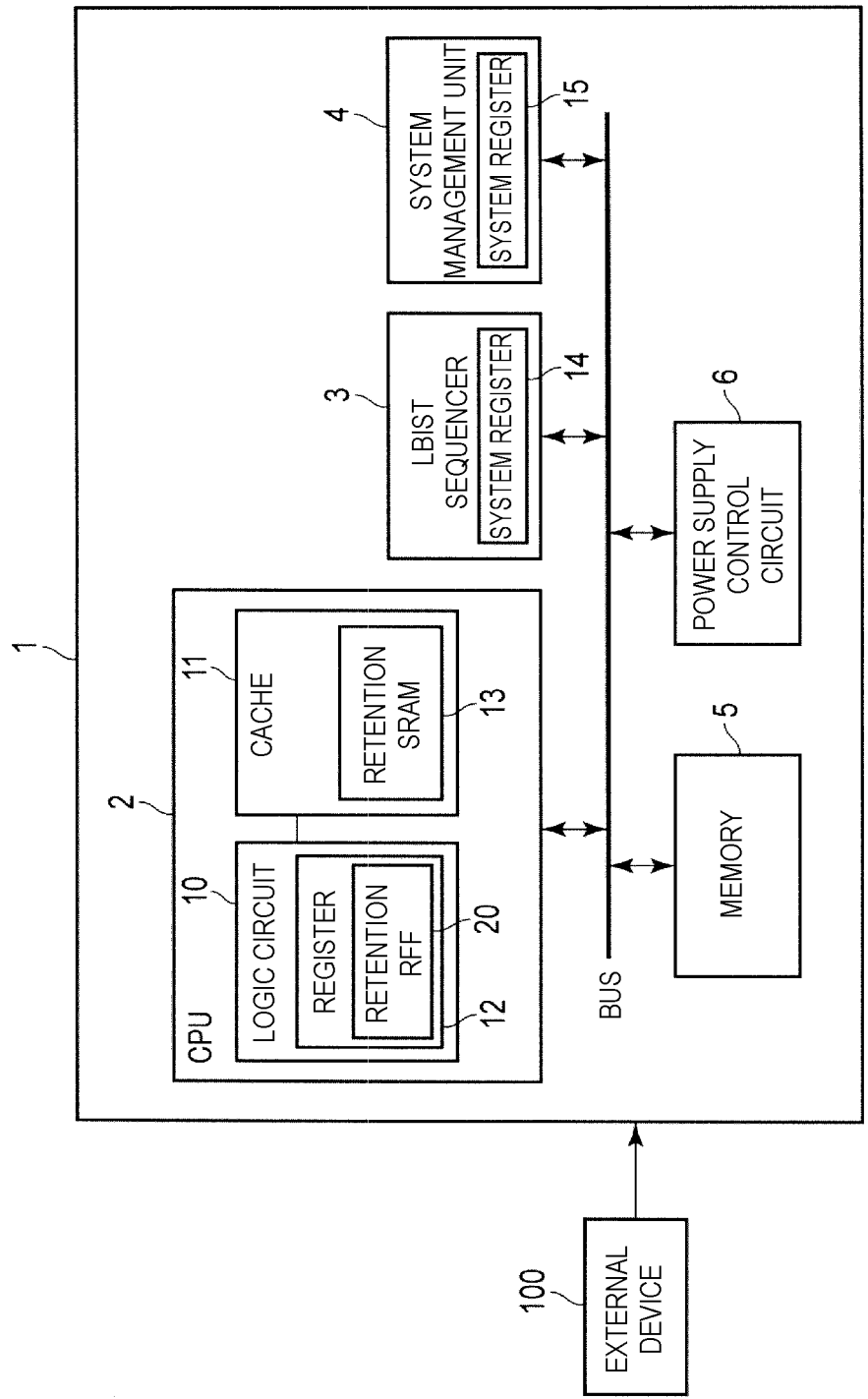
FIG. 1 is a block diagram of a semiconductor device according to a first embodiment.

According to an embodiment, a semiconductor device comprises a first flip-flop circuit that includes a first latch and a second latch coupled to the first latch. The first latch stores data in a first operating mode in which power is supplied to the first latch and is shut off in a second operating mode in which power is not supplied to the first latch. The second latch can store the data from the first latch during a transition from the first operating mode to the second operating mode. The first latch can be tested during a first period in the first operating mode, and the second latch retains the data from the first latch during the first period and can be tested during a second period beginning in the first operating mode.

Example embodiments will now be described with reference to the accompanying drawings. In the following description, common components are denoted by the same reference numerals throughout the drawings.

1. First Embodiment

A semiconductor device according to a first embodiment will be described. In the following description, an example where the semiconductor device is a system-on-chip (SoC) will be described.

1. 1. Configuration of Semiconductor Device
FIG. 1 is a block diagram of the semiconductor device according to the first embodiment.

As shown in FIG. 1, a system-on-chip (SoC) 1 is connected to an external device 100. SoC 1 performs various processes (tasks) in response to instruction (s) from the external device 100. The SoC 1 in the first embodiment has a function of stopping the power supply to some of circuits in the SoC 1 and shifting to a low power consumption state when not performing a task. Hereinafter, a state in which the power supply to the SoC 1 is not shut off is referred to as a "normal operation mode" and a low power consumption state in which the SoC 1 is not performing a task is referred to as a "low power mode."

In addition, the SoC 1 periodically performs a logic built in self test (hereinafter referred to as "LBIST" or simply "test") and performs a failure diagnosis when in the normal operation mode. In the LBIST, a flip-flop in a logic circuit is tested by using a test pattern (or "scan pattern") incorporated in the logic circuit in advance.

The SoC 1 includes a central processing unit (CPU) 2, an LBIST sequencer 3, a system management unit (SMU) 4, a memory 5 and a power supply control circuit 6, which are connected to one another via an internal bus.

The CPU 2 includes a logic circuit 10 and a cache 11. In response to an instruction from the external device 100, the CPU 2 controls various tasks and the LBIST in the SoC 1. The CPU 2 periodically performs the LBIST during the normal operation mode period. When a failure is detected by the LBIST, the CPU 2 notifies the external device 100 of a failure diagnosis result.

The CPU 2 may be a single core or a multi-core CPU, or may a multi-cluster having a plurality of CPUs. Hereinafter, a case where the CPU 2 is a single core will be described as an example.

The logic circuit 10 performs various arithmetic processing for performing a task. The logic circuit 10 includes a register 12 used for arithmetic processing.

The register 12 is used for arithmetic processing performed by the logic circuit 10 and includes a plurality of flip-flops 20 having a retention function capable of retaining data (hereinafter referred to as "retention flip-flop (RFF)" or "retention FF") even in a low power mode ("retention FF" in FIG. 1).

Each of the retention flip-flops 20 includes a normal latch and a balloon latch (details of which will be described later). In the normal operation mode, the normal latch is used for the arithmetic processing or the LBIST for the logic circuit 10 to perform a task. In the low power mode, the normal latch is placed in a pause (power supply stop) state. The balloon latch retains the data of the normal latch while the LBIST is being performed on the normal latch or while the normal latch is in the pause state. Hereinafter, a state in which the balloon latch retains the data of the normal latch in the retention flip-flop 20 is referred to as a "retention mode", and a state in which the balloon latch does not retain the data of the normal latch, that is, the normal latch is in a normally operable state is referred to as a "normal mode."

The cache 11 temporarily retains information (data, address, program, etc.) necessary for the logic circuit 10 to perform various arithmetic processing, and transmits this information to the logic circuit 10. Here, the cache 11 includes a plurality of SRAMs 13 (hereinafter referred to as a "retention SRAM" (retention static random access memory) having a retention function capable of retaining data even in the low power mode, for example.

Each of the retention SRAMs 13 includes a memory core portion that retains data, and a peripheral circuit portion that controls data input/output to the memory core. Since power is supplied to the memory core portion even in the low power mode, for example, the retention SRAM 13 can retain data. However, since power supply to the peripheral circuit portion is stopped during the low power mode, data cannot be input or output. Hereinafter, a state in which the retention SRAM 13 is in a normally operable state, that is, a state in which data can be input/output is referred to as a "normal mode." Further, a state in which no power is supplied to the peripheral circuit portion included in the retention SRAM 13 and while the memory core portion retains data is referred to as a "retention mode."

The LBIST sequencer 3 includes, a system register 14, and, upon receiving a signal from the CPU 2, performs the LBIST. More specifically, the LBIST in the first embodiment includes a normal latch test for testing a normal latch and a balloon latch test for testing a balloon latch. The normal latch test and the balloon latch test are performed in different periods. The signal related to a normal latch test transmitted from the CPU 2 to the LBIST sequencer 3 is designated signal NLT, and a signal related to a balloon latch test is designated signal BLT. When signal NLT is asserted at the "H" level, a "1" is set in the system register 14 corresponding to a normal latch test, and the LBIST sequencer 3 performs the normal latch test.

On the other hand, when signal BLT is asserted at the "H" level, a "1" is set in the system register 14 corresponding to a balloon latch test, and the LBIST sequencer 3 performs the balloon latch test. The system register 14 corresponding to a normal latch test or a balloon latch test may be provided external to the LBIST sequencer 3 in some embodiments. In response to the signal NLT or the signal BLT, the LBIST sequencer 3 configures a scan chain (test pattern) according to the normal latch test or the balloon latch test, and performs the LBIST.

The LBIST sequencer 3 performs a failure diagnosis using the result of the LBIST, and, if a failure is detected, notifies the CPU 2, the system management unit 4, or the external device 100 of the failure.

Upon completion of the normal latch test or the balloon latch test, the LBIST sequencer 3 notifies the system management unit 4 that the test is completed. The end signal of a normal latch test transmitted from the LBIST sequencer 3 to the system management unit 4 is designated signal NLF and an end signal of a balloon latch test is designated signal BLF, for example. When signal NLF is asserted at the "H" level, a "1" is set in the system register 15 corresponding to a normal latch test in the system management unit 4. On the other hand, when signal BLF is asserted at the "H" level, a "1" is set in the system register 15 corresponding to a balloon latch test in the system management unit 4.

The system management unit 4 controls the clock or reset of the entire SoC 1 and includes, for example, the system register 15 corresponding to a normal latch test and a balloon latch test. Upon receiving the notification from the LBIST sequencer 3 that the test has been completed, the system management unit 4 performs post-processing that may be appropriate according to the test (for example, return processing of the CPU 2 in the normal latch test).

The memory 5 is a semiconductor memory such as a DRAM (dynamic random access memory), for example. The memory 5 retains data, commands, programs of various tasks and the like input from the external device 100, for example. The memory 5 in the first embodiment retains a test pattern setting, a test program, test data and the like when the LBIST is performed. It is noted that, in the first embodiment, a case where the memory 5 is incorporated within SoC 1 will be described, but the memory 5 may be mounted external to the SoC 1, for example, the memory 5 may be incorporated in the external device 100. In addition, the test pattern setting, the test program, the test data and the like when the LBIST is performed may be retained in an external memory (Flash memory or the like), or may be implemented as an OTP (one time programmable) memory using eFuse in the SoC 1, a ROM, or hard wired logic.

The power supply control circuit 6 generates a voltage in the SoC 1 and supplies the generated voltage to each circuit. The power supply control circuit 6 has a function of shifting to the low power mode and a function of returning to the normal operation mode by controlling stop and restart of power supplied to some of circuits in the SoC 1. More specifically, upon receiving a pause signal for shifting to the low power mode from the CPU 2, the power supply control circuit 6 cuts-off the power supplied to the CPU 2, the LBIST sequencer 3, the system management unit 4, and the memory 5 to shift to the low power mode. Further, in response to the reception of a signal from the external device 100, for example, the power supply control circuit 6 restarts the power to the CPU 2 and the like to return to the normal operation mode. When shifting from the normal operation mode to the low power mode, the power supply control circuit 6 cuts-off power supplied to the normal latch but continues to supply power to the balloon latch.

1. 2. Retention Flip-Flop

Next, the retention flip-flop 20 will be described with reference to FIG. 2.

Figure 2:
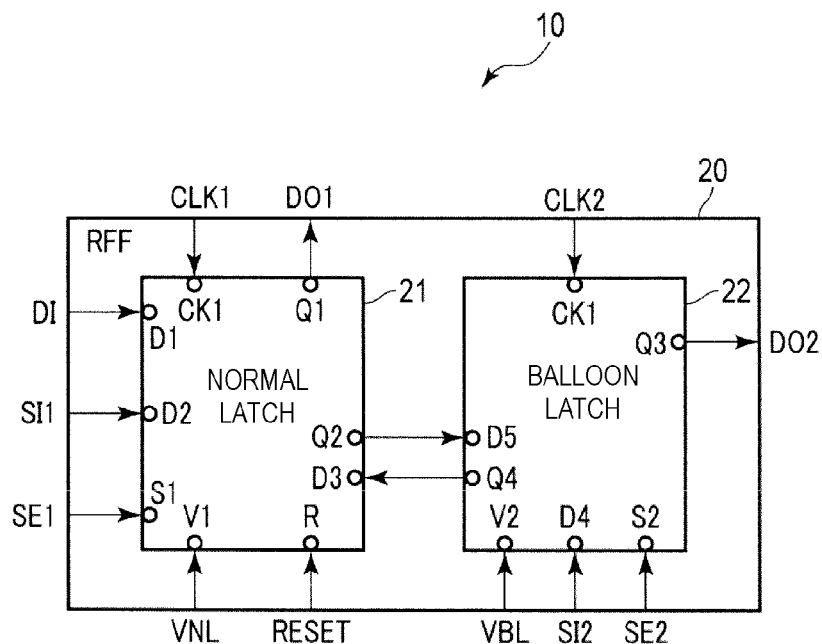
FIG. 2 is a block diagram of a retention flip-flop included in the semiconductor device according to the first embodiment.

As shown in FIG. 2, the retention flip-flop 20 includes a normal latch 21 and a balloon latch 22.

The normal latch 21 is used for arithmetic processing of the logic circuit 10 and the normal latch test during a normal operation mode period. During a low power mode period, the supply of power supply voltage VNL to the normal latch 21 is stopped, and the normal latch 21 enters a sleep state. The power supply voltage VNL can be supplied from the power supply control circuit 6 to the normal latch 21. Data retained in the normal latch 21 is transferred to the balloon latch 22 when the retention flip-flop 20 shifts from the normal mode to the retention mode. Further, when the retention flip-flop 20 returns from the retention mode to the normal mode, the data transferred to the balloon latch 22 is read back to the normal latch 21.

The normal latch 21 includes data input terminals D1, D2, and D3, a control signal input terminal S1, a power supply terminal V1, a reset signal input terminal R, a clock signal input terminal CK1, and data output terminals Q1 and Q2. It is noted that the normal latch 21 may include additional terminals. For example, the normal latch 21 may include an input terminal for a retention mode control signal for controlling switching between a normal mode and a retention mode.

Data DI is input to the data input terminal D1. The data DI corresponds to various arithmetic processing of the logic circuit 10, and is input to the normal latch 21.

For example, scan data SI1 is input to the data input terminal D2. The scan data SI1 is test data used for a normal latch test and is transmitted from the LBIST sequencer 3 to the normal latch 21. Hereinafter, at the time of the LBIST, a plurality of retention flip-flops 20 are connected in series to forma scan chain, and a testis performed, which is referred to as a scan, and data used for the scan (LBIST) is referred to as scan data. It is noted that, in addition to the LBIST, a test for each retention flip-flop 20 includes a failure test (manufacturing inspection) at manufacturing and an initial diagnostic test performed every time at power-on (at startup). During these tests, test data different from that for the LBIST may be input to the data input terminal D2.

A scan enable signal SE1 is input to the control signal input terminal S1. The scan enable signal SE1 enables a normal latch test, and is asserted, for example, at "H" level. The scan enable signal SE1 is transmitted from the LBIST sequencer 3 to the normal latch 21.

Power supply voltage VNL is applied to a power supply terminal V1 from the power supply control circuit 6.

A reset signal RESET is input to the reset signal input terminal R. The reset signal RESET, for example, resets the normal latch 21 after the LBIST, and is transmitted from the system management unit 4 to the normal latch 21.

A clock signal CLK1 is input to a clock signal input terminal CK1. The clock signal CLK1 is transmitted from the system management unit 4 to the normal latch 21.

Output data DO1 is output from a data output terminal Q1. The output data DO1 is used for the arithmetic processing of the logic circuit 10 and a normal latch test.

A data input terminal D3 and a data output terminal Q2 are used for transmitting and receiving data to and from the balloon latch.

The balloon latch 22 retains data of the normal latch 21 during a normal latch test and during a low power mode period. Therefore, the balloon latch 22 is supplied with power supply voltage VBL from the power supply control circuit 6 during the low power mode period. The balloon latch 22 is in a standby state when the retention flip-flop 20 is in a normal mode, and in an operation state when it is in a retention mode. Therefore, a balloon latch test is performed while the balloon latch 22 is in a standby state, that is, while the retention flip-flop 20 is in a normal mode.

The balloon latch 22 includes data input terminals D4 and D5, a control signal input terminal S2, a power supply terminal V2, a clock signal input terminal CK2 and data output terminals Q3 and Q4. It is noted that the balloon latch 22 may include another terminal. For example, the balloon latch 22 may include an input terminal for a retention mode control signal for controlling switching between a normal mode and a retention mode.

For example, scan data SI2 is input to the data input terminal D4. The scan data SI2 is test data used for a balloon latch test and is transmitted from the LBIST sequencer 3 to the balloon latch 22.

A scan enable signal SE2 is input to the control signal input terminal S2. The scan enable signal SE2 enables a balloon latch test, and is asserted, for example, at "H" level. The scan enable signal SE2 is transmitted from the LBIST sequencer 3 to the normal latch 21.

Power supply voltage VBL is applied to a power supply terminal V2 from the power supply control circuit 6.

A clock signal CLK2 is input to a clock signal input terminal CK2. The clock signal CLK2 is transmitted from the system management unit 4 to the balloon latch 22. It is noted that the frequency of the clock signal CLK2 may be the same as or different from the frequency of the clock signal CLK1. For example, a balloon latch test is processed in parallel with a normal mode period, during which the CPU2 is performing a task during a normal operation mode period. Therefore, during a balloon latch test, power consumption by the balloon latch test is added to power consumption by a task, and thus, power consumption of the entire SoC 1 increases. When the frequency of the clock signal CLK2 increases, the processing capability of the balloon latch test improves, but the power consumption also increases. Therefore, the frequency of the clock signal CLK2 is set such that the power consumption of the entire SoC 1 stays within the power consumption allowed by the system.

Output data DO2 is output from a data output terminal Q3. The output data DO 2 is used for a balloon latch test.

A data input terminal D5 and a data output terminal Q4 are used for transmitting and receiving data to and from the balloon latch, and connected to the data output terminal Q2 and the data input terminal D3 of the normal latch, respectively. Next, the scan chain will be described with reference to FIG. 3. In the example in FIG. 3, the scan chain of a normal latch test is indicated by a solid line and the scan chain of a balloon latch test is indicated by a dotted line.

Figure 3:
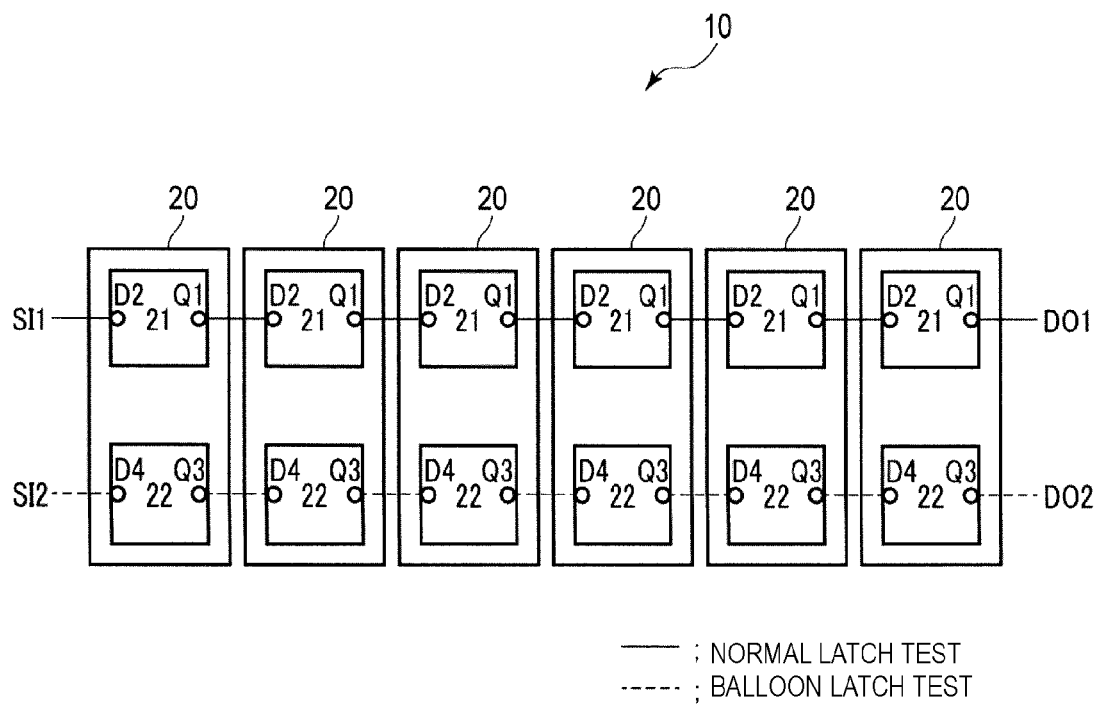
FIG. 3 is a block diagram showing a chain pattern in the semiconductor device according to the first embodiment.

As shown in FIG. 3, in a normal latch test, a plurality of normal latches 21 are connected in series to form a scan chain. More specifically, for example, the data output terminal Q1 of one normal latch 21 is connected to the data input terminal D2 of another (next-stage) normal latch 21. The output data DO1 from the normal latch 21 in the final stage of the scan chain is checked to confirm whether any failure has occurred.

Similarly, in a balloon latch test, a plurality of balloon latches 22 is connected in series to forma scan chain. More specifically, for example, the data output terminal Q3 of one balloon latch 22 is connected to the data input terminal D4 of another, adjacent balloon latch 22. The output data DO2 of the balloon latch 22 in the final stage of the scan chain is checked to confirm whether any failure has occurred.

1. 2. Flow of LBIST

Next, the flow of a normal latch test and the flow of a balloon latch test will be described.

1. 2. 1. Flow of Normal Latch Test

First, the flow of a normal latch test will be described with reference to FIG. 4.

Figure 4:
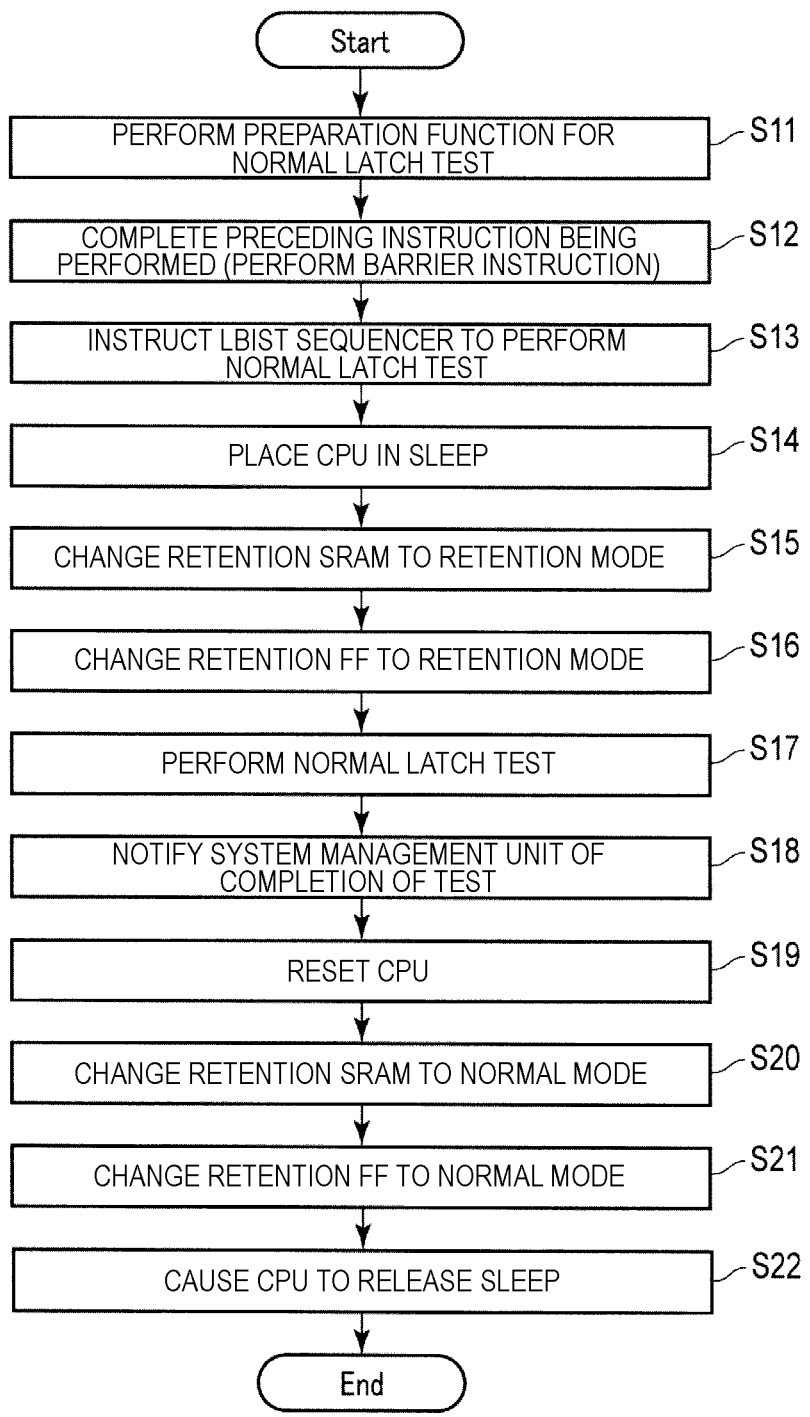
FIG. 4 is a flowchart of a normal latch test in the semiconductor device according to the first embodiment.

As shown in FIG. 4, after a certain period of time has elapsed since the start of a normal operation mode, or after a certain period of time has elapsed since the previous normal latch test, the CPU 2 performs (S11) a preparation function for a normal latch test. Here, the preparation function is processing associated with shifting to a normal latch test. The CPU 2 starts pre-processing for the normal latch test according to the preparation function for a normal latch test. It is noted that the normal latch test may be periodically performed during the normal operation mode period.

Next, the CPU 2 performs a barrier instruction for the pre-processing of the normal latch test (S12). Here, a barrier instruction refers to an instruction to complete a preceding instruction (that is, the task currently being performed) without executing a new task after completion of the preceding task/instruction.

Next, when the preceding task is completed, the CPU 2 instructs the LBIST sequencer 3 to perform a normal latch test (S13). More specifically, the CPU 2 checks the system register corresponding to the normal latch test in the LBIST sequencer 3. Then, if a "1" has been previously set in the system register corresponding to the normal latch test, the CPU 2 clears the system register to "0". Next, the CPU 2 sets the signal NLT to the "H" level for a certain time. When the signal NLT is set to the "H" level, a "1" is set in the system register corresponding to the normal latch test in the LBIST sequencer 3. It is noted that the system management unit 4 may also receive the signal NLT, in which case "1" can also be set in the system register corresponding to the normal latch test in the system management unit 4.

Next, the CPU 2 performs a sleep instruction and enters a sleep state (S14). Here, "sleep" refers to a state in which the CPU 2 does not accept a new instruction from the external device 100, that is, a state in which new tasks are not performed. In addition, the CPU 2 notifies the LBIST sequencer 3, the system management unit 4 or the like of the entering of the sleep state (e.g., transmits a SLEEP signal to these components). For example, the LBIST sequencer 3 may include a system register for storing the current sleep state of the CPU 2 therein. When the CPU 2 is in the sleep state, the LBIST sequencer 3 sets a "1" in this system register. The LBIST sequencer 3 performs a normal latch test when both the system register corresponding to the normal latch test and the system register storing the sleep state of the CPU 2 both retain "1" data.

Next, the LBIST sequencer 3 places the retention SRAM 13 in a retention mode (S15). The power supply control circuit 6 thus cuts-off power to the peripheral circuit portion of the retention SRAM 13.

Next, the LBIST sequencer 3 places the retention flip-flop (FF) 20 in a retention mode (S16). More specifically, the retention flip-flop 20 transfers the data in the normal latch 21 to the balloon latch 22. The power supply control circuit 6 cuts-off power supply to the normal latch 21. It is noted that the ordering of S15 and S16 may be arbitrarily set. The LBIST sequencer 3 may perform S16 before S15, or may perform S15 and S16 at the same time.

Next, the LBIST sequencer 3 performs the normal latch test (S17). More specifically, the LBIST sequencer 3 first configures a scan chain corresponding to the normal latch test. Next, after setting the scan enable signal SE1 to the "H" level, the LBIST sequencer 3 transmits the scan data SI1 to the retention flip-flop 20 (normal latch 21), and performs the normal latch test. After the normal latch test, the LBIST sequencer 3 checks the output data DO1. If a failure is detected, the LBIST sequencer 3 notifies, for example, the CPU 2 (when the CPU 2 itself can determine the notification result—for example, when CPU 2 is multi-core or multi-cluster processing system), the system management unit 4, the external device 100 or the like of any failure result.

Next, the LBIST sequencer 3 notifies the system management unit 4 of the completion of the normal latch test (S18). Specifically, the LBIST sequencer 3 sets the signal NLF to the "H" level for a certain time. Then, "1" is set in the system register corresponding to the completion of the normal latch test in the system management unit 4, for example.

Next, the system management unit 4 resets the CPU 2 as part of a LBIST post-processing (S19), more specifically, the system management unit 4 may assert a reset signal of a circuit (such as the normal latch 21) related to the normal latch test for a certain period, and then release the reset signal.

Next, the system management unit 4 places the retention SRAM 13 in the normal mode (S20). Thus, the power supply control circuit 6 supplies power to the peripheral circuit portion of the retention SRAM 13.

Next, the system management unit 4 places the retention flip-flop (FF) 20 in the normal mode (S21). More specifically, the power supply control circuit 6 supplies power to the normal latch 21 as controlled or instructed by the system management unit 4. Here, the retention flip-flop 20 restores the data from the balloon latch 22 to the normal latch 21.

Next, the system management unit 4 causes the CPU 2 to return from (release) the sleep state (S22). When the CPU 2 returns from the sleep state, the system management unit 4 reports the completion of the normal latch test to the CPU 2.

Furthermore, for example, the system management unit 4 clears the system register related to the sleep state of the CPU 2 in the LBIST sequencer 3 to a "0". Thus, the post-processing of the normal latch test is completed.

1. 2. 2. Flow of Balloon Latch Test

Next, the flow of a balloon latch test will be described with reference to FIG. 5. It is noted that, in the balloon latch test, the processing described in association with S12, S14 to S16, and S19 to S22 in FIG. 4 is unnecessary in the balloon latch test flow.

Figure 5:
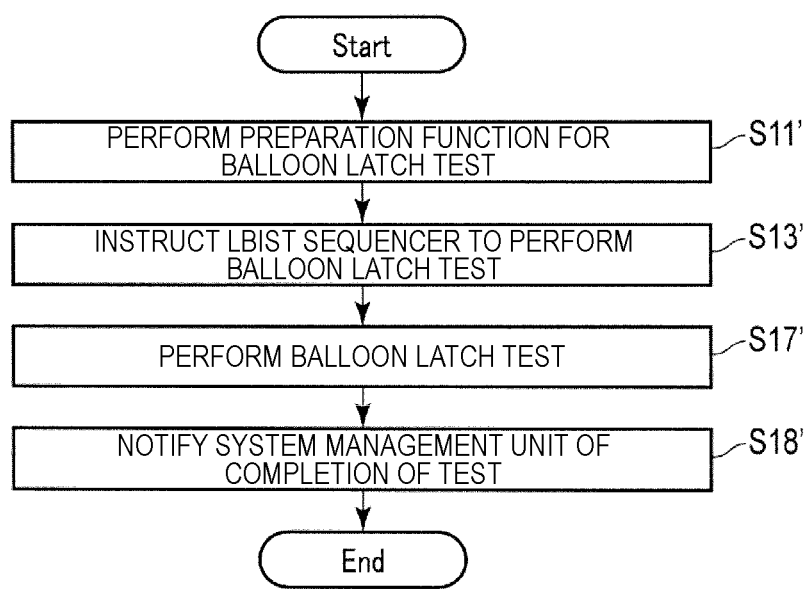
FIG. 5 is a flowchart of a balloon latch test in the semiconductor device according to the first embodiment.

As shown in FIG. 5, for example, after a certain period of time has elapsed since the start of a normal operation mode, or after a certain period of time has elapsed since the previous balloon latch test, the CPU 2 performs a preparation function for a balloon latch test (S11'). The balloon latch test can be performed in parallel with a task. Therefore, in the case of the balloon latch test, the barrier instruction and the sleep of the CPU 2 is not performed.

Next, the CPU 2 instructs the LBIST sequencer 3 to perform a balloon latch test (S13'). More specifically, the CPU 2 sets the signal BLT to the "H" level for a certain time. When the signal BLT is set to the "H" level, a "1" is set in the system register corresponding to the balloon latch test in the LBIST sequencer 3. It is noted that the system management unit 4 may also receive the signal BLT, in which case a "1" can also be set in the system register corresponding to the balloon latch test in the system management unit 4.

Next, the LBIST sequencer 3 performs the balloon latch test (S17'). More specifically, the LBIST sequencer 3 first configures a scan chain corresponding to the balloon latch test. Next, after setting the scan enable signal SE2 to the "H" level, the LBIST sequencer 3 transmits the scan data SI2 to the retention flip-flop 20, and performs the testing. The LBIST sequencer 3 checks the output data DO2. If a failure is detected, the LBIST sequencer 3 notifies the CPU 2, the system management unit 4 or the external device 100 of the failure result.

Next, the LBIST sequencer 3 notifies the system management unit 4 of the completion of the balloon latch test (S18'). Specifically, the LBIST sequencer 3 sets the signal BLF to the "H" level for a certain time. Then, a "1" is set in the system register corresponding to the completion of the balloon latch test in the system management unit 4, for example. In the case of the balloon latch test, since the LBIST post-processing performed by the system management unit 4 is unnecessary, the system management unit 4 can report to the CPU 2 that the balloon latch test has been completed. It is noted that even if the notification to the system management unit 4 is omitted, the LBIST sequencer 3 may report the completion of the balloon latch test to the CPU 2.

1. 3. Timing of Performing LBIST

Next, the timing of performing the LBIST will be described with reference to FIG. 6. In the example in FIG. 6, the transmission periods for the scan data SI1 and SI2 are indicated by hatched (filled) portions. Furthermore, the repetition of a normal latch test and a balloon latch test may be referred to as an LBIST cycle. For example, as depicted in FIG. 6, the period from the time t1 to the time t3 corresponds to one LBIST cycle.

Figure 6:
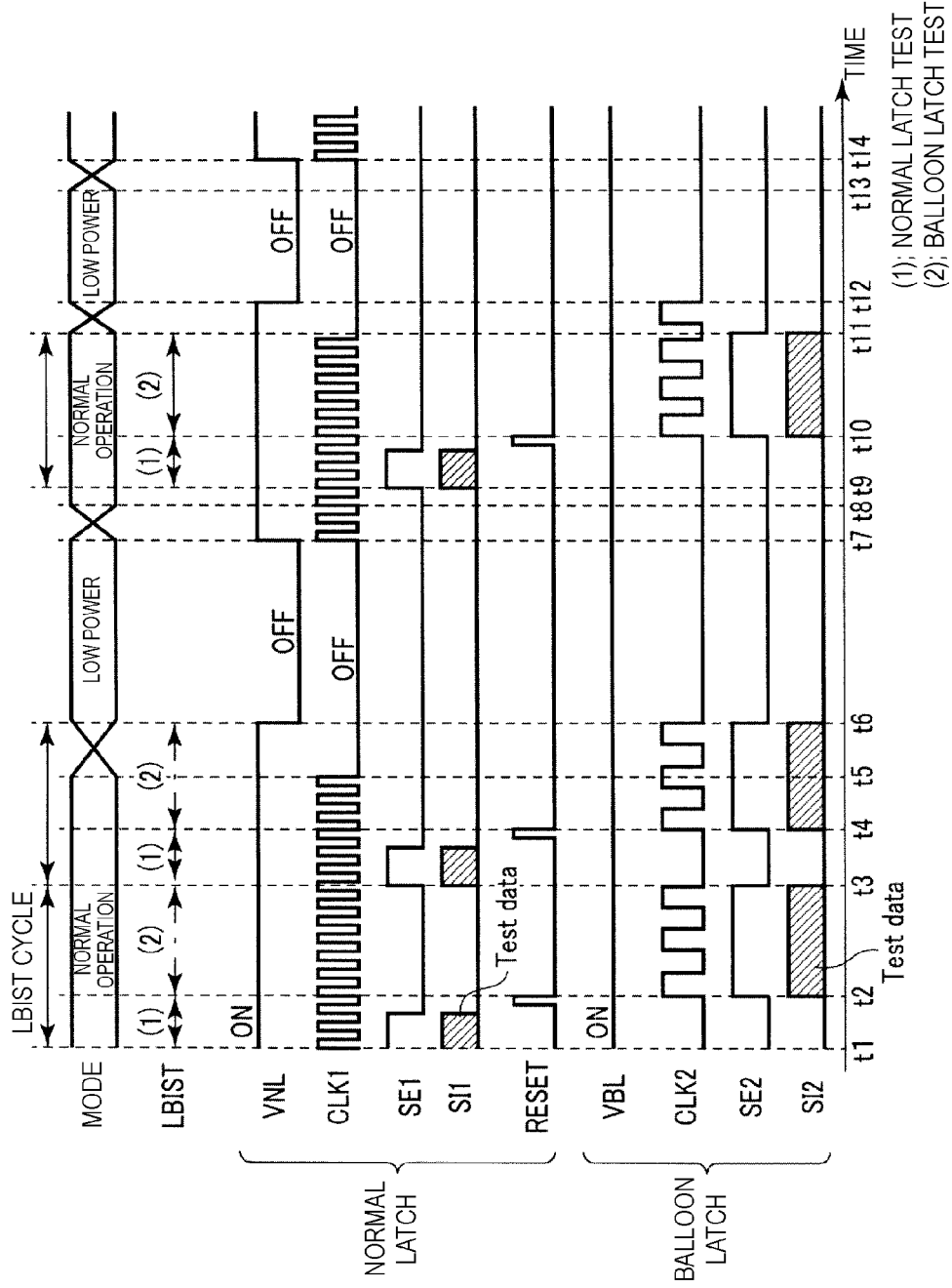
FIG. 6 is a timing chart showing the timing of an LBIST in the semiconductor device according to the first embodiment.

As depicted in FIG. 6, SoC 1 is in the normal operation mode at the time t1. During the normal operation mode period, the normal latch 21 and the balloon latch 22 are supplied with power supply voltages VNL and VBL, respectively. In this state, the CPU 2 starts a normal latch test. It is noted that, in the example in FIG. 6, the cycle of the clock signal CLK1 is shorter than the cycle of the clock signal CLK2, but, in general, the cycle of the clock signal CLK2 may be arbitrarily set. For example, the cycles of the clock signals CLK1 and CLK2 may be the same. Alternatively, the clock signals CLK1 and CLK2 may be asynchronous. Further, the clock signal CLK1 may have a different frequency in the normal latch test period and the balloon latch test period. Furthermore, in the example in FIG. 6, the normal latch test is started at the rise of the clock signal CLK1, but the normal latch test may instead be started at the falling timing of the clock signal CLK1.

In the period from the time t1 to the time t2 (normal latch test period; (1) in FIG. 6), the CPU 2 performs a normal latch test. More specifically, the clock signal CLK1 (for example, 100 MHz) is input to the retention flip-flop 20 in order to perform the normal latch test. It is noted that, in the example in FIG. 6, the clock signal CLK2 is in an OFF state, but while the retention flip-flop 20 shifts to the retention mode, the clock signal CLK2 is also input to the retention flip-flop 20. However, after the shift to the retention mode, the clock signal CLK2 becomes unnecessary. After the retention flip-flop 20 and the retention SRAM 13 shift to the retention mode, the LBIST sequencer 3 starts a normal latch test. After setting the scan enable signal SE1 to the "H" level, the LBIST sequencer 3 transmits the scan data SI1 to the normal latch 21.

Then, the LBIST sequencer 3 completes the transmission of the scan data SI1, and sets the scan enable signal SE1 to the "L" level upon completion of the normal latch test. Subsequently, the system management unit 4 performs post-processing for the normal latch test. More specifically, the system management unit 4 temporarily sets the reset signal RESET to the "H" level, and resets the normal latch 21. Subsequently, the system management unit 4 returns the retention flip-flop 20 and the retention SRAM 13 to the normal mode. The system management unit 4 reports the return to the normal mode to the CPU 2, thus, the post-processing for the normal latch test is completed.

In the period from the time t2 to the time t3 (balloon latch test period; (2) in FIG. 6), the CPU 2 performs a balloon latch test with any timing. More specifically, the clock signal CLK1 (for example, 1 GHz) and the clock signal CLK2 (for example, 10 MHz) are input to the retention flip-flop 20 in order to perform the task and the balloon latch test. During the balloon latch test, after setting the scan enable signal SE2 to the "H" level, the LBIST sequencer 3 transmits the scan data SI2 to the balloon latch 22.

Then, upon completion of the balloon latch test, the LBIST sequencer 3 completes the transmission of the scan data SI2 after setting the scan enable signal SE2 to the "L" level.

It is noted that in the example in FIG. 6, the scan enable signal SE2 is set to the "H" level, and the clock signal CLK2 and the scan data SI2 are in the transmission state throughout the period from the time t2 to the time t3. However, it suffices that the scan enable signal SE2 is set to the "H" level, and the clock signal CLK2 and the scan data SI2 are in the transmission state only for some portion of the period from the time t2 to the time t3 (the period during which the balloon latch test is performed).

Similar to the period from the time t1 to the time t2, the CPU 2 performs the normal latch test during the period from the time t3 to the time t4.

Similar to the period from the time t2 to the time t3, the CPU 2 performs the balloon latch test with any timing from the time t4 to the time t6. A case where the balloon latch test is not completed at the time t5 will be next described.

At the time t5, the CPU 2 starts preparation for shifting to the low power mode. However, if the balloon latch test is still being performed, the data of the normal latch 21 cannot be transferred to the balloon latch 22. In such a case, the LBIST sequencer 3 continues the balloon latch test until the balloon latch test has been completed. More specifically, the power supply control circuit 6 continues to supply the power supply voltage VNL to the normal latch 21. The system management unit 4 continues to transmit the clock signal CLK2. Further, the system management unit 4 stops the transmission of the clock signal CLK1 to the normal latch 21 (hereinafter referred to as "clock gating"). This causes the normal latch 21 to fix the output signal of the normal latch 21 (data is maintained/held) until the balloon latch is completed.

When the balloon latch test has been completed, the CPU 2 shifts the retention flip-flop 20 and the retention SRAM 13 to the retention mode. The system management unit 4 stops the transmission of the clock signal CLK2 and fixes the output signal of the balloon latch 22.

For example, after the preparation period for shifting to the preset low power mode, even if the software actually does not shift to the low power mode, it can be considered that the software shifts to the low power mode. Therefore, it can be said that the software is in a pseudo low power mode state during the period from when the software is first considered to have shifted to the low power mode until when the hardware actually shifts to the low power mode. That is, the hardware proceeds processing so that it may not be seen from the software. Therefore, when the balloon latch test is performed at the start of preparation for the shift to the low power mode, the state of SoC 1 shifts from the normal operation mode to the low power mode shift preparation to the pseudo low power mode, and to the low power mode.

At the time t6, the SoC 1 shifts to the low power mode. More specifically, the power supply control circuit 6 stops power supply to the peripheral circuit portion of the retention SRAM 13 and the normal latch 21 (hereinafter referred to as "power gating").

The SoC 1 maintains the low power mode during the period from the time t6 to the time t7.

At the time t7, for example, when a signal is input from the external device 100, the power supply control circuit 6 starts preparation for returning to the normal operation mode. More specifically, the power supply control circuit 6 restarts power supply to the peripheral circuit portion of the retention SRAM 13, the normal latch 21 and the like. The system management unit 4 transmits the clock signal CLK1 to the retention flip-flop 20. The CPU 2 returns the retention flip-flop 20 and the retention SRAM 13 to the normal mode.

At the time t8, the SoC 1 returns to the normal operation mode. Then, the CPU 2 performs a task during the period from the time t8 to the time t9.

Similar to the period from the time t1 to the time t2, the CPU 2 performs the normal latch test during the period from the time t9 to the time t10.

Similar to the period from the time t2 to the time t3, the CPU 2 performs the balloon latch test at any timing from the time t10 to the time t11.

At the time t11, the CPU 2 again starts preparation for shifting to the low power mode. At this time, since the LBIST is not currently being performed, the CPU 2 shifts the retention flip-flop 20 and the retention SRAM 13 to the retention mode after clock gating.

At the time t12, the SoC 1 performs power gating and shifts to the low power mode.

Similar to the period from the time t6 to the time t7, the SoC 1 maintains the low power mode during the period from the time t12 to the time t13.

Similar to the period from the time t7 to the time t8, the SoC 1 starts preparation for returning to the normal operation mode during the period from the time t13 to the time t14.

Similar to the time t8, the SoC 1 returns to the normal operation mode at the time t14.

1. 4. Effects of the First Embodiment

The configuration according to the first embodiment is capable of improving processing capability.

For example, in a semiconductor device compliant with ASIL (automotive safety integrity level), the failure detection rate of a flip-flop of a target circuit is determined according to the level of the ASIL (for example, ASIL-B or ASIL-D). Therefore, in the semiconductor device, in order to satisfy the failure detection rate, the LBIST can be periodically performed in the normal operation state. When the LBIST is performed, the state of the register (value of the flip-flop) in the CPU would be corrupted. For this reason, pre-processing and post-processing of the LBIST are necessary so as not to cause a problem when the LBIST is performed. For example, in pre-processing of the LBIST, it is necessary to evacuate the state of the register and information in the cache to the memory. Further, in post-processing of the LBIST, it is necessary to restart the CPU (perform the initialization sequence) or restore the CPU from a certain state after the information evacuated to the memory has been restored.

When the processing time of the pre-processing and the post-processing of the LBIST becomes longer, the ratio of the time during which the semiconductor device can actually perform a task becomes low with respect to the execution cycle of the LBIST. Therefore, the processing capability of the semiconductor device is reduced. For example, if the frequency of the LBIST is increased, the frequency of the clock signal related to the LBIST is increased, or the test pattern of the LBIST is increased with the high integration of the semiconductor device in order to increase the failure detection rate, the deterioration of the processing capability becomes unacceptable.

In contrast, the configuration according to the first embodiment includes the CPU 2 including the retention flip-flop 20 and the retention SRAM 13. This eliminates the need to evacuate the information in the register or the cache 11 to the memory 5. Moreover, this also eliminates the need to restart the CPU 2, thus an interruption restoration becomes possible. That is, the CPU 2 can restore and re-start the instructions before and after the LBIST is performed, thus, shortening the time for pre-processing and post-processing of the LBIST. That is, it is possible to increase the ratio of the time available for performing a task with respect to the execution cycle of the LBIST. Therefore, the processing capability of the semiconductor device can be improved.

Furthermore, since the ratio of the time for performing a task increases, a task whose processing time is relatively long can also be performed. Therefore, the degree of freedom in the development of the semiconductor device can be improved.

Furthermore, since the CPU 2 had to be reset (restarted) in the past, the LBIST had to be performed in units of circuits that can be reset. In contrast, the configuration according to the first embodiment eliminates the need for reset, thus, subdividing the units of circuits in which the LBIST is performed, and optimizing the failure detection pattern of the LBIST and the test algorithm is possible. As a result, the processing time of the LBIST can be reduced. Therefore, the processing capability of the semiconductor device can be improved.

Furthermore, the retention flip-flop 20 included in the semiconductor device according to the first embodiment can test the normal latch 21 and the balloon latch 22 separately. Since the balloon latch 22 can also be tested, it is possible to prevent a decrease in the failure detection rate of the semiconductor device by using the retention flip-flop 20.

Moreover, by using the retention flip-flop 20 and the retention SRAM 13, the low power consumption operation becomes possible. Therefore, the power consumption of the semiconductor device can be reduced.

Furthermore, the normal latch 21 and the balloon latch 22 can be tested in different periods. While the balloon latch 22 is being tested, the normal latch 21 can operate normally. That is, the balloon latch test can be performed in parallel with execution of a task. Therefore, it is possible to prevent a decrease in the ratio of the time for performing a task.

Furthermore, the configuration according to the first embodiment includes the LBIST sequencer 3. Therefore, by using the LBIST sequencer 3, the LBIST can be controlled by hardware instead of software. Since it is not necessary to control the LBIST by software in this first embodiment, the workload of the CPU 2 can be reduced. Therefore, the processing speed of the semiconductor device can be improved.

Furthermore, it is possible to simplify the programming related to the LBIST, thereby, reducing the development cost and shortening the development period of software.

2. Second Embodiment

Next, a second embodiment will be described. In the second embodiment, a case where the CPU 2 is a multi-core processor and corresponds to symmetric multiprocessing (SMP) will be described. In the symmetric multiprocessing, since processing is distributed among a plurality of cores, the cache 11 corresponding to each of the cores maintains consistency and shares a common memory space.

2. 1. Flow of Normal Latch Test

Figure 7:
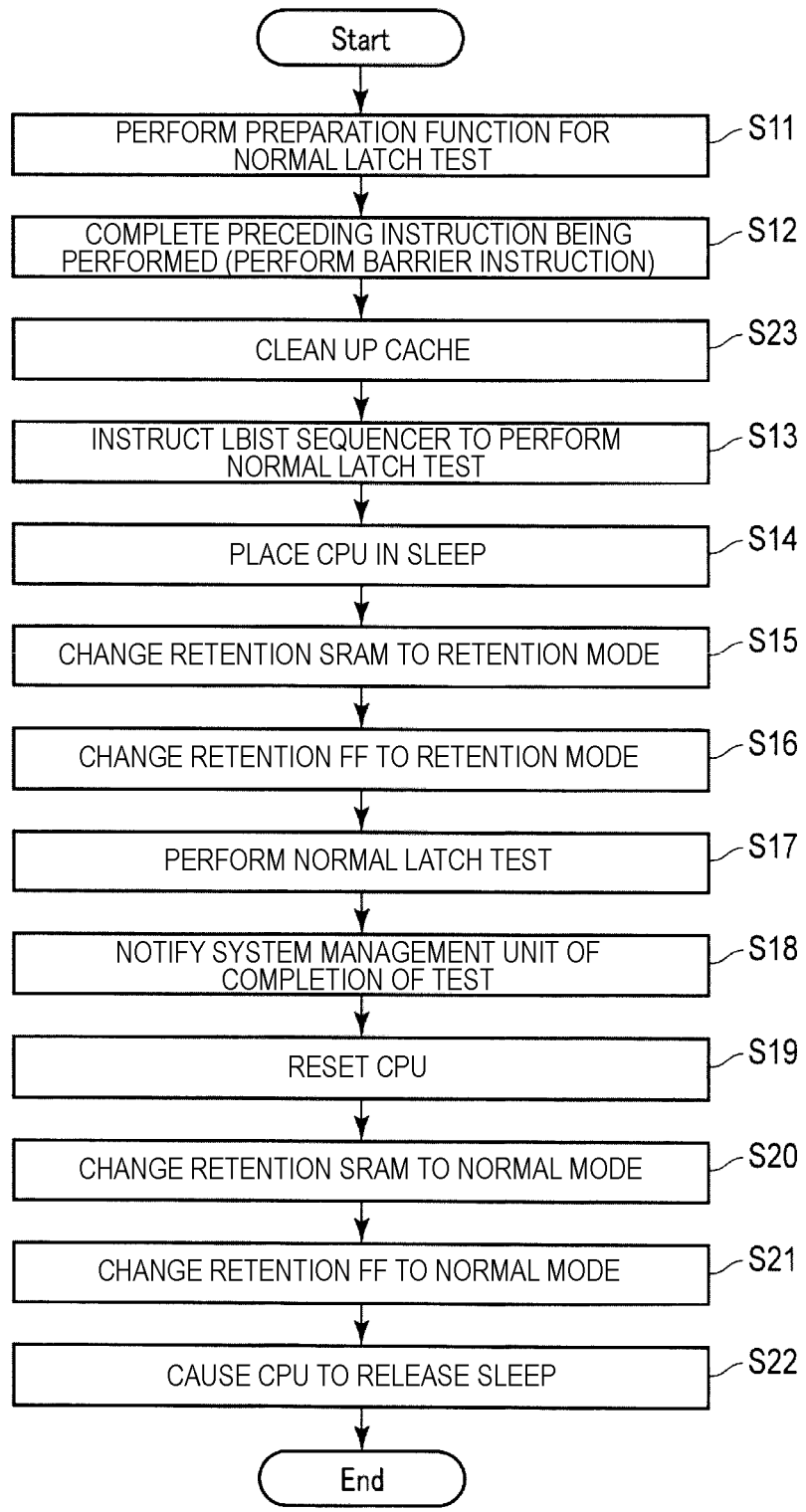
FIG. 7 is a flowchart of a normal latch test in the semiconductor device according to a second embodiment.

The flow of a normal latch test will be described with reference to FIG. 7. FIG. 7 shows a case where a normal latch test is performed for one core of the CPU 2. Each processing in S11, S12 and S13 to S22 is substantially the same as that in FIG. 4 of the first embodiment. Hereinafter, only the points different from the first embodiment will be described.

As shown in FIG. 7, after the barrier instruction is performed (S12), the CPU 2 cleans up the cache 11 (S23). More specifically, the CPU 2 temporarily reads the information stored in the memory 5 into the cache 11 and performs a task (which may alter the data content of memory 5). Therefore, the contents of the data in the cache 11 and the data in the memory 5 may be different. In symmetric multiprocessing, processing is distributed to a plurality of cores. Therefore, when one core performs the LBIST, if the data in the cache 11 differs from the corresponding data in the memory 5, or the data which is retained by only the core for the LBIST is in the cache 11, a problem may arise in the execution of a task using another core. Therefore, the CPU 2 transfers the data in the cache 11 to the memory 5 and performs a process called "cleaning" for matching the data in the cache 11 with the data in the memory 5. It is noted that the CPU 2 may perform invalidation processing of data in the cache 11 called "invalidation" after cleaning or at the same time as cleaning.

The subsequent processing is then same as in FIG. 4. It should be noted that an LBIST may be simultaneously performed for two or more cores.

2. 2. Effects of the Embodiment

According to the configuration of the second embodiment, substantially the same effects as in the first embodiment can be achieved.

3. Variations

A semiconductor device according to the above described first embodiment includes first and second operation modes (normal operation mode and low power mode). The semiconductor device includes a first flip-flop (20 in FIG. 2) including a first latch (21 in FIG. 2) which is operable in the first operation mode and in which a power supply is shut off in the second operation mode, and a second latch (22 in FIG. 2) which is capable of retaining data of the first latch while the power supply of the first latch is shut off. The first latch is used for a first test (normal latch test) performed during a first period. The second latch retains the data of the first latch during the first period ((1) in FIG. 6) and is used for a second test (balloon latch test) performed during a second period ((2) in FIG. 6) different from the first period.

For example, the CPU 2 in the above described second embodiment may include a multi-core or multi-cluster configuration as a subsystem. Alternatively, the CPU 2 may operate in either or both of symmetric multiprocessing that maintains cache coherency, or asymmetric multiprocessing that does not have cache coherency. Furthermore, the present disclosure is not limited to a central processor unit, and may be another hardware engine such as a graphics processing unit (GPU) or a digital signal processor (DSP).

Furthermore, the present disclosure is not limited to SoCs, and can be applied to any semiconductor device having an LBIST target circuit.

Furthermore, the term "connection" in the above described embodiments also includes a state of indirect connection with some elements interposed in the "connection", such as a transistor or a resistor.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a first flip-flop circuit that includes a first latch and a second latch coupled to the first latch; and
   a second flip-flop circuit that includes a third latch and a fourth latch coupled to the third latch, wherein
   the first latch stores data in a first operating mode in which power is supplied to the first latch and is shut off in a second operating mode in which power is not supplied to the first latch,
   the second latch can store the data from the first latch during a transition from the first operating mode to the second operating mode,
   the first latch can be tested during a first period in the first operating mode,
   the second latch retains the data from the first latch during the first period and can be tested during a second period beginning in the first operating mode,
   the third latch stores data in the first operating mode and is shut off in the second operating mode,
   the fourth latch can store the data from the third latch during the transition from the first operating mode to the second operating mode,
   the third latch can be tested during the first period, and
   the fourth latch retains the data from the third latch during the first period and can be tested during the second period.

2. The semiconductor device according to claim 1, wherein
   the second latch and the fourth latch each includes a data input terminal and a data output terminal for testing, and
   the data output terminal of the second latch is connected to the data input terminal of the fourth latch for testing during the second period.

3. The semiconductor device according to claim 1, further comprising:
   a static random access memory (SRAM) unit having a first state in which data input to the SRAM unit and data output from the SRAM unit is possible, and a second state in which data can be retained by the SRAM unit, but data cannot be input to or output from the SRAM unit;
   a first circuit that controls testing of the first latch and the second latch; and
   a second circuit that resets the first flip-flop circuit, wherein
   when the first latch is to be tested, the first circuit transfers the data of the first latch to the second latch, shifts the SRAM unit from the first state to the second state, and then tests the first latch,
   after the testing of the first latch, the second circuit resets the first latch, transfers the data retained in the second latch to the first latch, and shifts the SRAM unit from the second state to the first state, and
   when the second latch is to be tested, the first circuit tests the second latch without transferring data of the first latch to the second latch, or shifting the SRAM unit from the first state to the second state.

4. The semiconductor device according to claim 3, further comprising:
   a third circuit configured to supply power to the first and second latches; and
   a fourth circuit configured to control the first circuit, the second circuit, and the third circuit, wherein
   when receiving a request from the fourth circuit to shift to the second operation mode while the test of the second latch is being performed, the third circuit is configured to stop supplying power to the first latch once the test of the second latch has been completed.

5. The semiconductor device according to claim 1, wherein the second period extends into a transition period between the first operating mode and the second operating mode and ends at a beginning of the second operating mode.

6. The semiconductor device according to claim 1, wherein the first latch and the second latch operate at different clock frequencies.

7. The semiconductor device according to claim 1, wherein a clock signal is supplied to the second latch only during the second period.

8. The semiconductor device according to claim 1, wherein the first flip-flop is incorporated in a logic circuit that is in a system-on-a-chip (SoC).

9. The semiconductor device according to claim 1, wherein the first flip-flop is in a central processing unit (CPU).

10. The semiconductor device according to claim 1, wherein the first flip-flop is in a digital signal processor (DSP).

11. The semiconductor device according to claim 1, wherein the first latch comprises:
a first enable signal input terminal at which a signal enabling testing of the first latch can be input,
a first test data input terminal to which test data for testing the first latch can be input,
a first output terminal from which data from the first latch can be output,
a first clock signal input terminal to which a first clock signal can be input,
a reset signal input terminal to which a reset signal can be input, and
a first power supply terminal at which a first power supply voltage can be applied.

12. The semiconductor device according to claim 11, wherein the second latch comprises:
a second enable signal input terminal at which a signal enabling testing of the second latch can be input,
a second test data input terminal to which test data for testing the second latch can be input,
a second output terminal from which data from the second latch can be output,
a second clock signal input terminal at which a second clock signal can be input, and
a second power supply terminal at which a second power supply voltage can be applied.

13. A semiconductor device, comprising:
a multi-core processor including a register and a shared cache, the register including a first retention flip-flop, the shared cache including a static random access memory (SRAM) unit, the first retention flip-flop including a normal latch and a balloon latch coupled to the normal latch;
a system management unit configured to change operating modes of the first retention flip-flop and the SRAM unit in conjunction with a first testing operation on the normal latch;
a test sequencer configured to initiate the first testing operation, wherein
the balloon latch stores the data from the normal latch during the first testing operation,
the multi-core processor is placed in a sleep mode during a start of the first testing operation,
the SRAM unit is placed in a retention mode during the start of the first testing operation,
the first retention flip-flop is placed in a retention mode during the start of the first testing operation,
the system management unit resets the multi-core processor upon a completion of the first testing operation,
the SRAM unit is placed in a normal mode upon the completion of the first testing operation,
the first retention flip-flop is placed in a normal mode upon the completion of the first testing operation, and
the multi-core processor is released from the sleep mode after the completion of the first testing operation.

14. The semiconductor device according to claim 13, wherein the test sequencer is further configured to initiate a second testing operation on the balloon latch, the second testing operation being conducted with the multi-core processor being in a non-sleep mode, and the SRAM unit being in the normal mode.

15. The semiconductor device according to claim 14, wherein the multi-core processor can perform a task during the second testing operation.

16. A semiconductor device, comprising:
a flip-flop that includes a first latch which is operable in a first operating mode and in which a power supply is shut off in a second operating mode, and a second latch coupled to the first latch and which is capable of retaining data from the first latch while the power supply of the first latch is being shut off, wherein
the first latch includes:
a first enable signal input terminal corresponding to a first test on the first latch,
a first test data input terminal to which first test data used in the first test can be input,
a first output terminal at which data from the first latch can be output,
a first clock signal input terminal to which a first clock signal can be input,
a reset signal input terminal to which a reset signal can be input, and
a first power supply terminal to which a first power supply voltage can be applied; and
the second latch includes:
a second enable signal input terminal corresponding to a second test on the second latch,
a second test data input terminal to which second test data used in the second test can be input,
a second output terminal at which data from the second latch can be output,
a second clock signal input terminal to which a second clock signal can be input, and
a second power supply terminal to which a second power supply voltage can be applied.

17. The semiconductor device according to claim 16, wherein the first latch is a normal latch and the second latch is a balloon latch.

18. The semiconductor device according to claim 16, wherein the second operating mode is a lower power consumption mode than the first operating mode.

19. The semiconductor device according to claim 16, further comprising:
a static random access memory (SRAM) unit having a first state in which data input to the SRAM unit and data output from the SRAM unit is possible, and a second state in which data can be retained by the SRAM unit, but data cannot be input to or output from the SRAM unit;
a first circuit that controls testing of the first latch and the second latch; and
a second circuit that resets the flip-flop, wherein
when the first latch is to be tested in the first test, the first circuit transfers the data of the first latch to the second latch, shifts the SRAM unit from the first state to the second state, and then tests the first latch using the first test data,
after the first test, the second circuit resets the first latch, transfers the data retained in the second latch to the first latch, and shifts the SRAM unit from the second state to the first state, and
when the second latch is to be tested in the second test using the second test data, the first circuit tests the second latch without transferring data of the first latch to the second latch, or shifting the SRAM unit from the first state to the second state.

* * * * *